United States Patent
Liao et al.

(10) Patent No.: US 10,678,133 B2
(45) Date of Patent: Jun. 9, 2020

(54) METHOD FOR FORMING PHOTORESIST LAYER

(71) Applicant: Taiwan Semiconductor Manufacturing Co., Ltd., Hsinchu (TW)

(72) Inventors: Chi-Hung Liao, New Taipei (TW); Wei-Chang Cheng, Taichung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/714,817

(22) Filed: Dec. 16, 2019

(65) Prior Publication Data

US 2020/0117090 A1 Apr. 16, 2020

Related U.S. Application Data

(62) Division of application No. 15/884,299, filed on Jan. 30, 2018, now Pat. No. 10,509,321.

(51) Int. Cl.
| | |
|---|---|
| *H05B 3/22* | (2006.01) |
| *H01L 21/3213* | (2006.01) |
| *G03F 7/09* | (2006.01) |
| *G03F 7/16* | (2006.01) |
| *G03F 7/095* | (2006.01) |
| *G03F 7/30* | (2006.01) |
| *G01K 13/02* | (2006.01) |
| *H01L 21/67* | (2006.01) |
| *H01L 21/66* | (2006.01) |

(52) U.S. Cl.
CPC .............. *G03F 7/094* (2013.01); *G01K 13/02* (2013.01); *G03F 7/095* (2013.01); *G03F 7/16* (2013.01); *G03F 7/162* (2013.01); *G03F 7/30* (2013.01); *H01L 21/32139* (2013.01); *H01L 21/67017* (2013.01); *H01L 21/67109* (2013.01); *H01L 21/67248* (2013.01); *H05B 3/22* (2013.01); *H01L 22/12* (2013.01); *H01L 22/20* (2013.01)

(58) Field of Classification Search
CPC ......... H01L 21/67017; H01L 21/67109; H01L 21/32139
See application file for complete search history.

(56) References Cited

U.S. PATENT DOCUMENTS

| | | | | |
|---|---|---|---|---|
| 2010/0122772 A1* | 5/2010 | Hayashi | ............ | H01L 21/67051 156/345.21 |
| 2011/0265951 A1* | 11/2011 | Xu | ..................... | C23C 16/45561 156/345.26 |

(Continued)

Primary Examiner — Mounir S Amer
(74) Attorney, Agent, or Firm — JCIPRNET

(57) ABSTRACT

A method for forming a photoresist layer includes the following steps. A first photoresist layer is formed on a first wafer provided on a platen. The platen includes a plurality of temperature zones being at a first set of process temperatures. A first etching process is performed on the first wafer to form a first patterned metal layer. A profile variation of the first patterned metal layer with respect to a reference profile is determined. The first set of process temperatures is adjusted to a second set of process temperatures according to the profile variation. A second photoresist layer is formed on a second wafer provided on the platen with the temperature zones being at the second set of process temperatures respectively.

20 Claims, 8 Drawing Sheets

(56) References Cited

U.S. PATENT DOCUMENTS

2012/0080061 A1* 4/2012 Kim .................. F26B 5/005
   134/95.2
2013/0078809 A1* 3/2013 Yu .................. H01L 21/31111
   438/689
2019/0333820 A1* 10/2019 Chang ............. H01L 21/823431

* cited by examiner

METHOD FOR FORMING PHOTORESIST LAYER

CROSS-REFERENCE TO RELATED APPLICATION

This application is a divisional application of and claims the priority benefit of a prior application Ser. No. 15/884,299, filed on Jan. 30, 2018. The entirety of each of the above-mentioned patent applications is hereby incorporated by reference herein and made a part of this specification.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon. Many integrated circuits are typically manufactured on a single semiconductor wafer. The dies of the wafer may be processed and packaged at the wafer level, and various technologies have been developed for wafer level packaging.

The numerous processing steps are used to cumulatively apply multiple electrically conductive and insulating layers on the wafer and pattern the layers to form the circuits. The final yield of functional circuits on the wafer depends on proper application of each layer during the process steps. Proper application of those layers depends, in turn, on coating the material in a uniform spread over the surface of the wafer in an economical and efficient manner.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
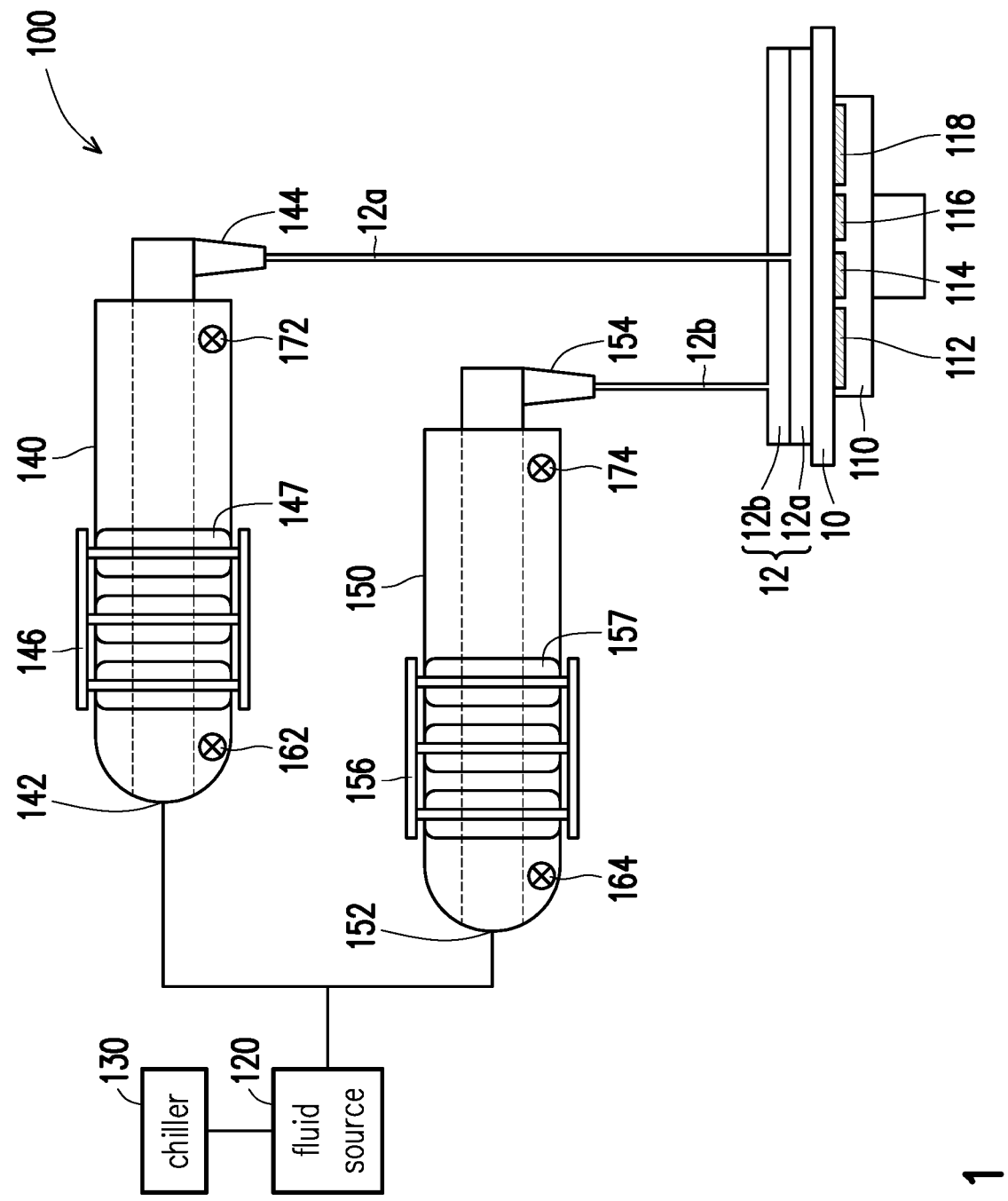
FIG. 1 illustrates a schematic view of a temperature controlling apparatus according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

FIG. 1 illustrates a schematic view of a temperature controlling apparatus according to some embodiments of the present disclosure. Referring to FIG. 1, in an implementation of the disclosure, a temperature controlling apparatus 100 can be adopted as a part of an temperature control system for a wafer manufacturing process. Certainly, the application of the temperature controlling apparatus 100 is not limited thereto. In some embodiments, the temperature controlling apparatus 100 includes a platen 110, a fluid source 120, a chiller 130, and a plurality of conduits 140, 150. In one of the implementations, the platen 110 is configured to carry a wafer 10. The platen 110 can be, for example, an electrostatic chuck. As such, an electrostatic force is applied to the platen 110 for holding the wafer 10 securely during a spin coating process. In other embodiments, the platen 110 may be a vacuum chuck or any suitable platen capable of holding the wafer 10 securely with any suitable means. The fluid source 120 is configured to contain a fluid therein for supplying the fluid. The chiller 130 is connected to the fluid source 120 for cooling the fluid in the fluid source 120 to a cooling temperature. In some embodiments, the chiller 130 may include a fluid channel for circulating a refrigerant controlled to a desired temperature.

In some embodiments, the conduits 140, 150 are in fluid communication with the fluid source 120. As such, the fluid source 120 is configured to supply the fluid to the conduits 140, 150. Each of the conduits 140 and 150 includes a heater 146/156. The heaters 146 and 156 are configured to heat the fluids in the conduits 140 and 150 respectively, and the heating temperature of the fluid in one of the conduits 140/150 is different from the heating temperature of the fluid in another one of the conduits 150/140. Namely, the fluids in the conduits 140 and 150 are heated to different temperatures by the heaters 140 and 156 in a controllable manner respectively. The fluid heated by each of the heaters 146 and 156 may then be dispensed on the wafer 10 carried by the platen 220 through each of the conduits 140 and 150.

In some embodiments, the temperature controlling apparatus 100 may further include inlet thermal sensors 162, 164 and outlet thermal sensors 172, 174. The inlet thermal sensors 162, 164 are disposed at inlets 142, 152 of the conduits 140, 150 for sensing temperature of the fluid (before being heated) entering the conduits 140, 150 respectively. The outlet thermal sensors 172, 174 are disposed at outlets 144, 154 of the conduits 140, 150 for sensing temperature of the fluid (after being heated) dispensed from the outlets 144, 154 respectively. The thermal sensors 162, 164, 172, 174 may be couple to a controller (e.g. the controller 180 shown in FIG. 2) of the temperature controlling apparatus 100, such that the controller is configured to control the heaters 146, 156 to heat the fluid to designated temperatures according to the sensing signals sent from the thermal sensors 162, 164, 172, 174.

For example, the conduits described above may include a first conduit 140 and a second conduit 150. The first conduit 140 includes a first inlet 142, a first outlet 144 and a first heater 146. In some embodiments, the first inlet 142 and the first outlet 144 are disposed on two opposite ends of the first conduit 140, and the first heater 146 is disposed on the first conduit 140 and located between the first inlet 142 and the first outlet 144. The first inlet 142 is in fluid communication with the fluid source 120, such that the fluid in the fluid source 120 cooled to the cooling temperature flows to the first inlet 142 in a controllable manner. The first heater 146 is configured to heat the fluid from the cooling temperature to a first heating temperature, and the fluid 12a heated by the first heater 146 is then dispensed on the platen 110 through the first outlet 144 as shown in FIG. 1. In some embodiments, the first heating temperature of the fluid 12a in the conduits 140 may be substantially equal to or higher than 22° C. and be substantially lower than 100° C. or the boiling point of the fluid 12a, for example.

The second conduit 150 may be in a similar arrangement. For example, the second conduit 150 includes a second inlet 152, a second outlet 154 and a second heater 156. The second inlet 152 is in fluid communication with the fluid source 120, such that the fluid in the fluid source 120 cooled to the cooling temperature flows to the second inlet 152 in a controllable manner. The second heater 156 is configured to heat the fluid from the cooling temperature to a second heating temperature, wherein the second heating temperature is different from the first heating temperature. In some embodiments, the second heating temperature may be substantially higher than 0° C. or the freezing point of the fluid 12b and be substantially equal to or lower than 22° C., for example, Then, the fluid 12b heated by the second heater 156 is dispensed on the platen 110 through the second outlet 154. In other words, the fluids 12a and 12b in the first conduit 140 and the second conduit 150 are heated to different temperatures by the first heater 146 and the second heater 156 respectively, and the fluids 12a and 12b with different temperatures are dispensed on the platen 110 through the first outlet 144 and the second outlet 154 respectively. It is noted that two conduits 140, 150 are depicted herein for illustration purpose, but the number of the conduits of the temperature controlling apparatus 100 is not limited thereto.

Accordingly, the fluids 12a with the first heating temperature and the fluid 12b with the second heating temperature may reach thermal equilibrium on the platen 110 to form a resultant layer 12 with a desired heating temperature. In some embodiments, the desired heating temperature of the resultant layer 12 may be substantially higher than 0° C. or the freezing point of the fluid 12a/12b and be substantially lower than 100° C. or the boiling point of the fluid 12a/12b. In some embodiments, the fluid 12a from the first conduit 140 and the fluid 12b from the second conduit 150 may be dispensed on the platen 110 sequentially. In other embodiments, the fluid in the first conduit 140 and the fluid in the second conduit 150 may be dispensed on the platen 110 at the same time. With such configuration, the temperature controlling apparatus 100 can control the temperature of the fluid in each conduit 140/150 and the temperature of the resultant layer 12 formed on the platen 110 more precisely and efficiently. In some embodiments, the viscosity of the fluid is inversely proportional to the temperature of the fluid. Namely, the higher the temperature of the fluid gets, the lower the viscosity of the fluid is. Accordingly, the thickness of the resultant layer 12 would be thinner when the viscosity of the resultant layer 12 is lower. Thereby, the thickness of the resultant layer 12 formed on the platen 110 can be controlled by adjusting the temperature of the fluid.

In some embodiments, the fluid may be a photoresist coating. Photoresist materials (e.g. polymer) are coated onto the wafer 10 by dispensing the photoresist coating typically on the center of the wafer 10, and the platen 110 carrying the wafer 10 may spin at high speeds for spreading the photoresist coating evenly on the wafer 10. In such embodiment, a first photoresist coating 12a heated to a first heating temperature by the first heater 146 may be dispensed on the wafer 10, and a second photoresist coating 12b heated to a second heating temperature by the second heater 156 may also be dispensed on the wafer 10. In some embodiments, the first heating temperature and the second heating temperature are both substantially higher than the cooling temperature. For example, the first heating temperature of the fluids 12a in the conduits 140 may be substantially equal to or higher than 22° C. and substantially lower than 100° C. or the boiling point of the fluid 12a. The second heating temperature of the fluid 12b in the conduits 150 may be substantially higher than 0° C. or the freezing point of the fluid 12a and substantially equal to or lower than 22° C. It is noted that the numerical ranges described herein are merely for illustration purpose and the disclosure is not limited thereto. As such, the first photoresist coating 12a and the second photoresist coating 12b stacked on top of one another (or mixed together) form a photoresist layer 12 on the wafer 10. With such configuration, the temperature and the viscosity of the photoresist layer 12 on the wafer 10 can be controlled by adjusting the first heating temperature of the first photoresist coating 12a and the second heating temperature of the second photoresist coating 12b. In some embodiments, when the photoresist layer 12 is lower in viscosity, the photoresist layer 12 tends to spread out more during the spinning of the platen 110, and the viscosity of the photoresist layer 12 is inversely proportional to the temperature of the photoresist layer 12. Accordingly, the thickness of the photoresist layer 12 formed on the wafer 10 can be controlled by adjusting the temperatures of the first photoresist coating 12a and the second photoresist coating 12b.

In some embodiments, the inlet thermal sensor 162 is disposed at the first inlet 142 for sensing temperature (e.g. the cooling temperature) of the fluid entering the first conduit 140, and the inlet thermal sensor 164 is disposed at the second inlet 152 for sensing temperature (e.g. the cooling temperature) of the fluid entering the second conduit 150. The outlet thermal sensor 172 is disposed at the first outlet 144 for sensing temperature (e.g. the first heating temperature) of the fluid discharging from the first conduit 140, and the outlet thermal sensor 174 is disposed at the second outlet 154 for sensing temperature (e.g. the second heating temperature) of the fluid discharging from the second conduit 150. The thermal sensors 162, 164, 172, 174 may be couple to the controller 180 of the temperature controlling apparatus 100, such that the controller is configured to control the heaters 146, 156 to heat the fluid to designated temperatures according to the sensing signals sent from the thermal sensors 162, 164, 172, 174. Thereby, the heating temperature of the fluid 12a/12b dispensed from the conduit 140/150 can be controlled and adjusted immediately (e.g. in real time) according to the feedback from the thermal sensors 162, 164, 172, 174.

Figure 2:
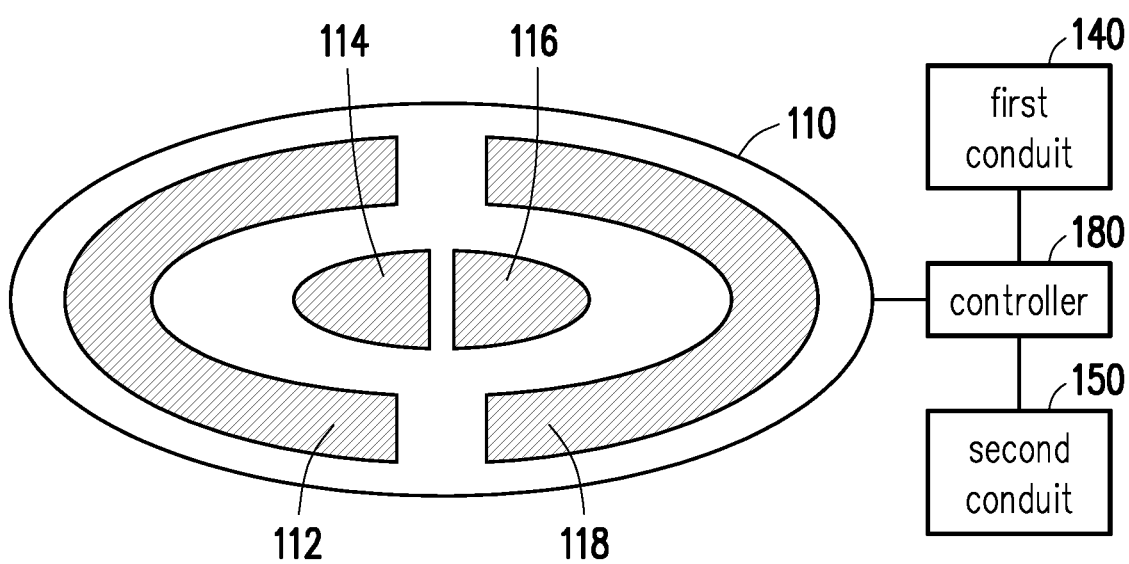
FIG. 2 is a block diagram of a temperature controlling apparatus according to some embodiments of the present disclosure.

FIG. 2 is a block diagram of a temperature controlling apparatus according to some embodiments of the present disclosure. In some embodiments, the platen 110 includes a plurality of temperature zones 112, 114, 116, 118, and each of the temperature zones 112, 114, 116, 118 includes a temperature adjusting element 112/114/116/118 embedded in the platen 110, such that the temperature of the platen 110 can be controlled regionally. In other words, the temperatures of the platen 110 on different temperature zones 112, 114, 116, 118 can be controlled independently. In some embodiments, the temperature adjusting elements such as heaters and/or chillers may be embedded in the temperature zones 112, 114, 116, 118 and coupled to the controller 180 so as to control temperature profile of the platen 110 by controlling the temperature adjusting elements in the temperature zones 112, 114, 116, 118 independently. In some embodiments, the temperature zones 112, 114, 116, 118 include central temperature zones 114, 116 and peripheral temperature zones 112, 118, wherein the central temperature zones 114, 116 are located at a central region of the platen 110 while the peripheral temperature zones 112, 118 surround the central temperature zone 114, 116 as shown in FIG. 2. With such configurations, the temperatures of the central region and the peripheral region of the wafer 10 can be independently control in order to meet this process condition. It is noted that the arrangement of the temperature zones 112, 114, 116, 118 on the platen 110 is not limited thereto.

In some embodiments, the heater 146/156 of each of the conduits 140, 150 may include an electrical resistance heater, a heater bar, an infrared heater, or any other suitable heater. In the embodiment of the heater 146/156 being an electrical resistance heater, the first heater 146 includes a first electrical resistance heater 146, and the second heater 156 includes a second electrical resistance heater 156. The electrical resistance heaters 146, 156 may include electrical resistance coils winding around the first conduit 140 and the second conduit 150. In some embodiments, each of the conduits 140 and 150 may include a metal ring 147/157 surrounding each of the conduits 140 and 150. The electrical resistance coils of the electrical resistance heaters 146, 156 are in contact with the metal rings 147 and 157 respectively to heat up the fluid in the conduits 140 and 150. In some embodiments, the electric current applied to the first electrical resistance heater 146 is different from the electric current applied to the second electrical resistance heater 156, such that the fluids in the first conduit 140 and the second conduits 150 can be heated to different temperatures in a controllable manner. As such, the fluids 12a, 12b with different temperatures are dispensed on the platen 110 to form the resultant layer 12 with a desired temperature. In some embodiments, the controller 180 may be coupled to the first heater 146 and the second heater 156 to control the electric current applied thereon according to the sensing signals sent from the thermal sensors 162, 164, 172, 174. Thereby, the heating temperature of the fluid 12a/12b dispensed from the conduit 140/150 can be adjusted immediately by controlling the electric current applied on the heater 146/156 according to the feedback from the thermal sensors 162, 164, 172, 174.

Figure 3:
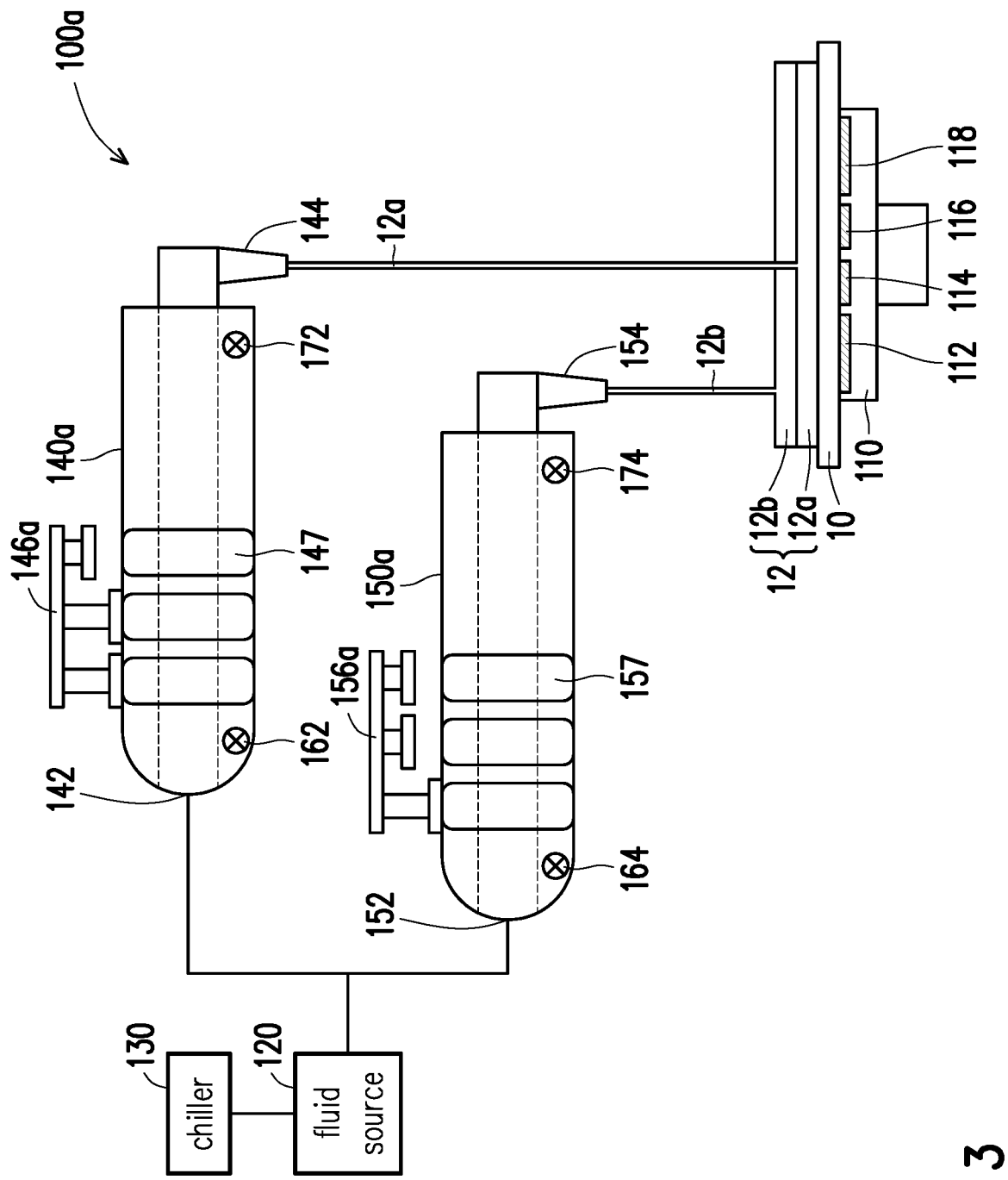
FIG. 3 illustrates a schematic view of a temperature controlling apparatus according to some embodiments of the present disclosure.

FIG. 3 illustrates a schematic view of a temperature controlling apparatus according to some embodiments of the present disclosure. It is noted that the temperature controlling apparatus 100a shown in FIG. 3 contains many features same as or similar to the temperature controlling apparatus 100 disclosed earlier with FIG. 1 and FIG. 2. For purpose of clarity and simplicity, detail description of same or similar features may be omitted, and the same or similar reference numbers denote the same or like components. The main differences between the temperature controlling apparatus 100a shown in FIG. 3 and the temperature controlling apparatus 100 shown in FIG. 1 and FIG. 2 are described as follows.

In some embodiments, the first heater 146a includes at least one first heater bar, the second heater 156a includes at least one second heater bar. In some embodiments, each of the conduits 140 and 150 may include a metal ring 147/157 surrounding each of the conduits 140 and 150. The heater bars of heaters 146a, 156a are in contact with the metal rings 147 and 157 respectively to heat up the fluid in the conduits 140a and 150a. The contact area of first heater bar for contacting the first conduit 140a is different from the contact surface of the second heater bar for contacting the second conduit 150a, such that the fluids in the first conduit 140a and the second conduits 150a can be heated to different temperatures in a controllable manner. As such, the fluids 12a, 12b with different temperatures are dispensed on the platen 110 to form the resultant layer 12 with a desired temperature.

In one of the implementations, the first heater 146a may include a plurality of first heater bars (three heater bars are illustrated), and the second heater 156a includes a plurality of second heater bars (three heater bars are illustrated). Two of the first heater bars are in contact with the metal ring 147 of the first conduit 140a, while merely one of the second heater bars are in contact with the metal ring 157 of the second conduit 150a. With such configuration, the contact area of the first heater bar is greater than the contact surface of the second heater bar, so the first heating temperature of the fluids 12a in the first conduit 140a is higher than the second heating temperature of the fluids 12b in the second conduits 150a. In some embodiments, the first heating temperature and the second heating temperature are both substantially higher than the cooling temperature. For example, the first heating temperature of the fluids 12a in the conduits 140a may be substantially equal to or higher than 22° C. and substantially lower than 100° C. or the boiling point of the fluid 12a. The second heating temperature of the fluid 12b in the conduits 150a may be substantially higher than 0° C. or the freezing point of the fluid 12a and substantially equal to or lower than 22° C. It is noted that the numerical ranges described herein are merely for illustration purpose and the disclosure is not limited thereto. In some embodiments, the controller 180 may be coupled to the first heater 146a and the second heater 156a to control the contact area of each heater 146a/156a (or the number of the heater bars contacting the conduits) according to the sensing signals sent from the thermal sensors 162, 164, 172, 174. Thereby, the heating temperature of the fluid 12a/12b dispensed from the conduit 140a/150a can be adjusted immediately by controlling the contact area of the heater 146a/156a according to the feedback from the thermal sensors 162, 164, 172, 174.

Figure 4:
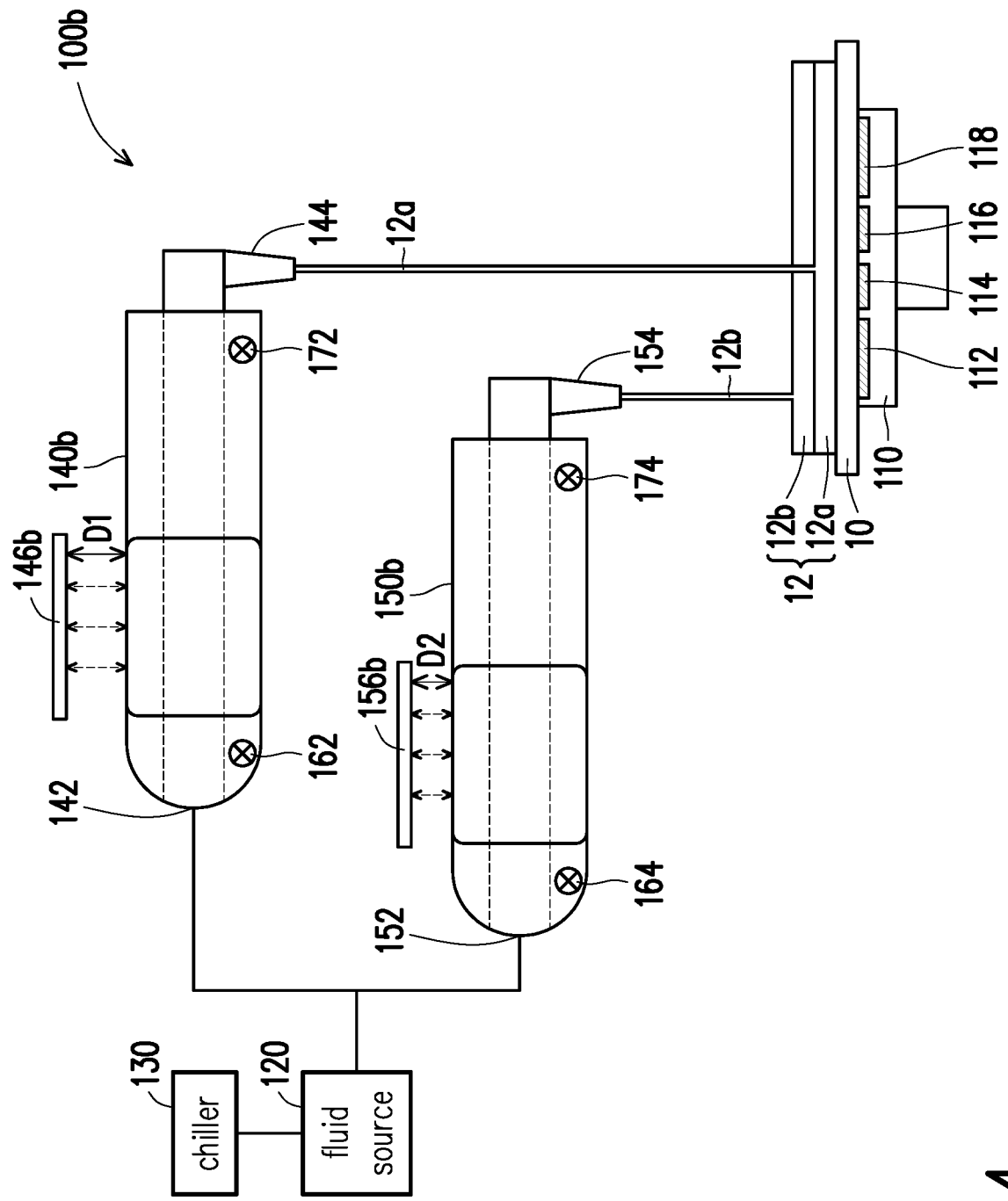
FIG. 4 illustrates a schematic view of a temperature controlling apparatus according to some embodiments of the present disclosure.

FIG. 4 illustrates a schematic view of a temperature controlling apparatus according to some embodiments of the present disclosure. It is noted that the temperature controlling apparatus 100b shown in FIG. 4 contains many features same as or similar to the temperature controlling apparatus 100 disclosed earlier with FIG. 1 and FIG. 2. For purpose of clarity and simplicity, detail description of same or similar features may be omitted, and the same or similar reference numbers denote the same or like components. The main differences between the temperature controlling apparatus 100b shown in FIG. 4 and the temperature controlling apparatus 100 shown in FIG. 1 and FIG. 2 are described as follows.

In some embodiments, the first heater 146b includes a first infrared heater 146b, and the second heater 156b includes a second infrared heater 156b. The infrared heaters 146b, 156b with higher temperatures are configured to transfer energy to the conduits 140, 150 with lower temperatures through electromagnetic radiation. With such configuration, the distance D1 between the first infrared heater 146b and the first conduit 140b is different from the distance D2 between the second infrared heater 156b and the second conduit 150b, such that the fluids in the first conduit 140b and the second conduits 150b can be heated to different temperatures in a controllable manner. As such, the fluids 12a, 12b with different temperatures are dispensed on the platen 110 to form the resultant layer 12 with a desired temperature. For example, the distance D1 between the first infrared heater 146b and the first conduit 140b is substantially greater than the distance D2 between the second infrared heater 156b and the second conduit 150b as shown in FIG. 4. Accordingly, the first heating temperature of the fluids 12a in the first conduit 140b is substantially lower than the second heating temperature of the fluids 12b in the second conduits 150b. For example, the first heating temperature of the fluids 12a in the conduits 140b may be substantially higher than 0° C. or the freezing point of the fluid 12a and substantially equal to or lower than 22° C. The second heating temperature of the fluid 12b in the conduits 150b may be substantially equal to or higher than 22° C. and substantially lower than 100° C. or the boiling point of the fluid 12b. It is noted that the numerical ranges described herein are merely for illustration purpose and the disclosure is not limited thereto. In some embodiments, the controller 180 may be coupled to the first heater 146b and the second heater 156b to control the distance between each heater 146b/156b and each conduit 140b/150b according to the sensing signals sent from the thermal sensors 162, 164, 172, 174. Thereby, the heating temperature of the fluid 12a/12b dispensed from the conduit 140b/150b can be adjusted immediately by controlling the distance between the heater 146b/156b and the conduit 140b/150b according to the feedback from the thermal sensors 162, 164, 172, 174.

Figure 5:
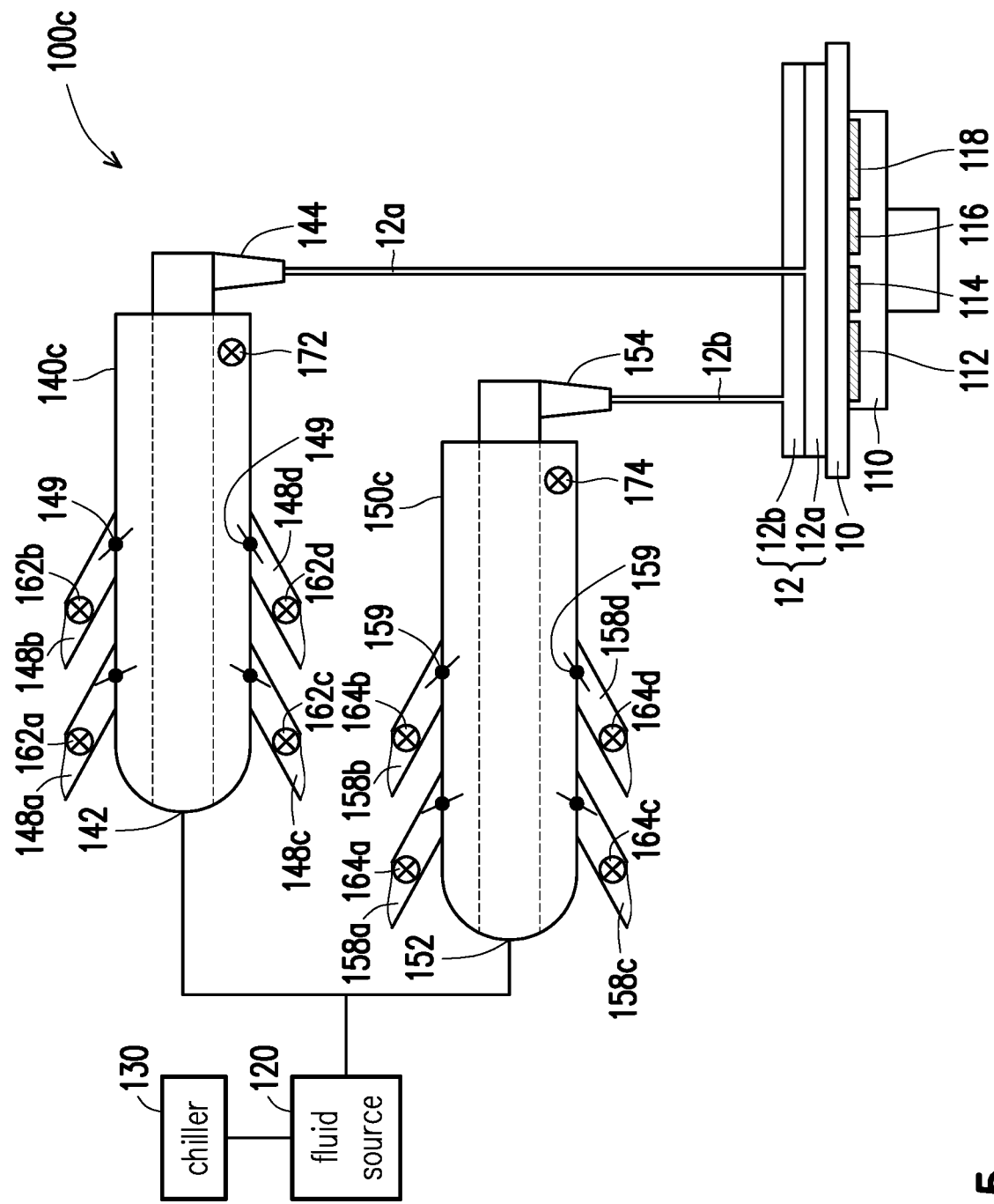
FIG. 5 illustrates a schematic view of a temperature controlling apparatus according to some embodiments of the present disclosure.

FIG. 5 illustrates a schematic view of a temperature controlling apparatus according to some embodiments of the present disclosure. It is noted that the temperature controlling apparatus 100c shown in FIG. 5 contains many features same as or similar to the temperature controlling apparatus 100 disclosed earlier with FIG. 1 and FIG. 2. For purpose of clarity and simplicity, detail description of same or similar features may be omitted, and the same or similar reference numbers denote the same or like components. The main differences between the temperature controlling apparatus 100c shown in FIG. 5 and the temperature controlling apparatus 100 shown in FIG. 1 and FIG. 2 are described as follows.

In some embodiments, the temperature of the fluid in each conduit 140c/150c can be controlled by mixing fluids with different temperatures. For example, the first conduit 140c may include a plurality of first pipelines 148a, 148b, 148c, 148d, which are in fluid communication with the fluid source 120 and the first conduit 140c. In some embodiments, each of the first pipelines 148a, 148b, 148c, 148d may include a flow control valve 149 such as solenoid valve coupled to the controller 180, such that the fluid from the fluid source 120 can flow into the first conduit 140c through the first pipelines 148a, 148b, 148c, 148d in a controllable manner. The first heater described above can be disposed on at least one of the first pipelines 148a, 148b, 148c, and 148d to heat the fluid therein. In some embodiments, each pipelines 148a, 148b, 148c, 148d may be configured with its own heater, and the temperature of the fluid in each of the pipelines 148a, 148b, 148c, and 148d may be different from one another. The controller 180 is coupled to the flow control valves 149 to control the amount of the fluid flowing from each pipelines 148a, 148b, 148c, and 148d to obtain the desired temperature (e.g. the first heating temperature) of the fluid 12a in the first conduit 140c. In other words, the fluids with different temperatures from the first pipelines 148a, 148b, 148c, 148d are mixed in the first conduit 140c to reach the desired temperature (e.g. the first heating temperature). For example, the first heating temperature may be substantially equal to or higher than 22° C. and be substantially lower than 100° C. or the boiling point of the fluid.

Similarly, the second conduit 150c may include a plurality of second pipelines 158a, 158b, 158c, 158d, which are in fluid communication with the fluid source 120 and the second conduit 150c. In some embodiments, each of the second pipelines 158a, 158b, 158c, 158d may include a flow control valve 159 such as solenoid valve coupled to the controller 180, such that the fluid from the fluid source 120 can flow into the second conduit 150c through the second pipelines 158a, 158b, 158c, and 158d in a controllable manner. The second heater described above can be disposed on at least one of the second pipelines 158a, 158b, 158c, and 158d to heat the fluid therein. In some embodiments, each pipelines 158a, 158b, 158c, and 158d may be configured with its own heater, and the temperature of the fluid in each of the pipelines 158a, 158b, 158c, and 158d may be different from one another. The controller 180 is coupled to the flow control valves 159 to control the amount of the fluid flowing from each pipelines 158a, 158b, 158c, and 158d, to obtain the desired temperature (e.g. the second heating temperature) of the fluid 12b in the second conduit 150c. In other words, the fluids with different temperatures from the second pipelines 158a, 158b, 158c, 158d are mixed in the second conduit 150c in order to reach the desired temperature (e.g. the second heating temperature). For example, the second heating temperature may be substantially higher than 0° C. or the freezing point of the fluid and substantially equal to or lower than 22° C. Thereby, the heating temperature of the fluid 12a/12b dispensed from the conduit 140c/150c can be adjusted immediately by controlling the amount of the fluid flowing from each pipelines according to the feedback from the thermal sensors 162, 164, 172, 174.

Figure 6:
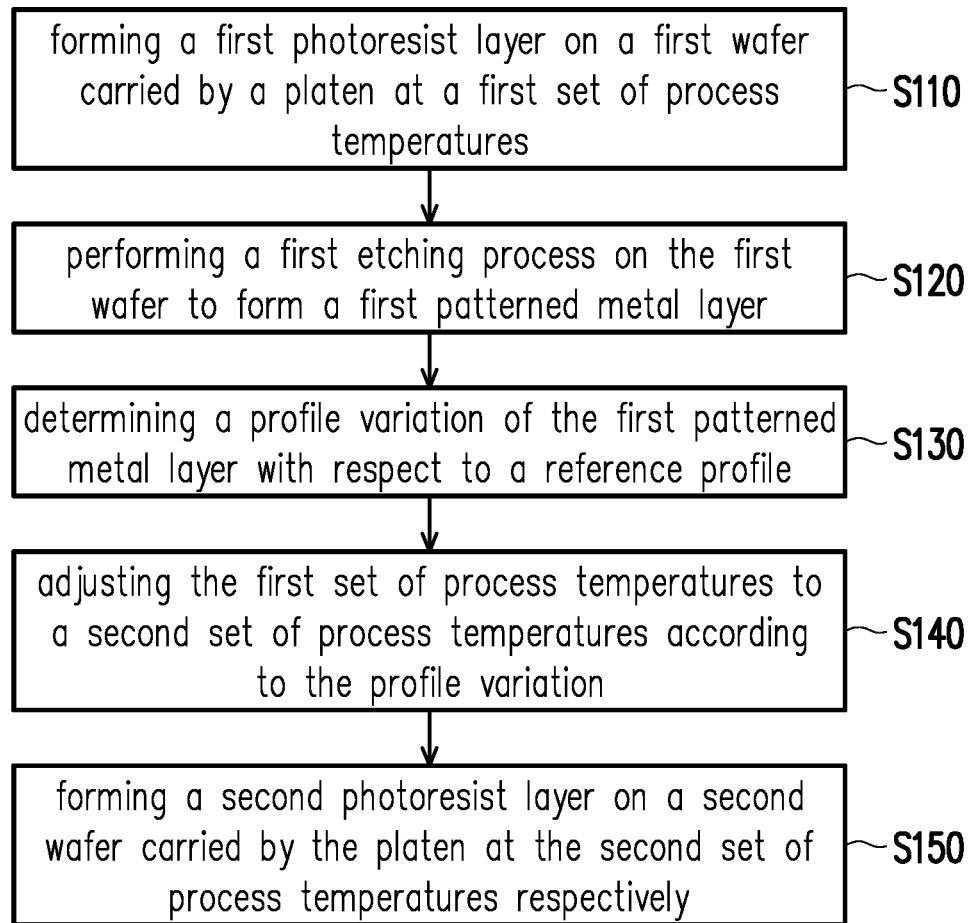
FIG. 6 is a block diagram depicting a process flow of a method for forming a photoresist layer according to some embodiments of the present disclosure.

FIG. 6 is a block diagram depicting a process flow of a method for forming a photoresist layer according to some embodiments of the present disclosure. FIG. 7 to FIG. 10 are schematic cross sectional views of various stages in the process of forming a photoresist layer according to some embodiments of the present disclosure. With the temperature controlling apparatus 100/100a/100b/100c described above, a method for forming a photoresist layer can be developed. The method may include the following steps.

Figure 7:
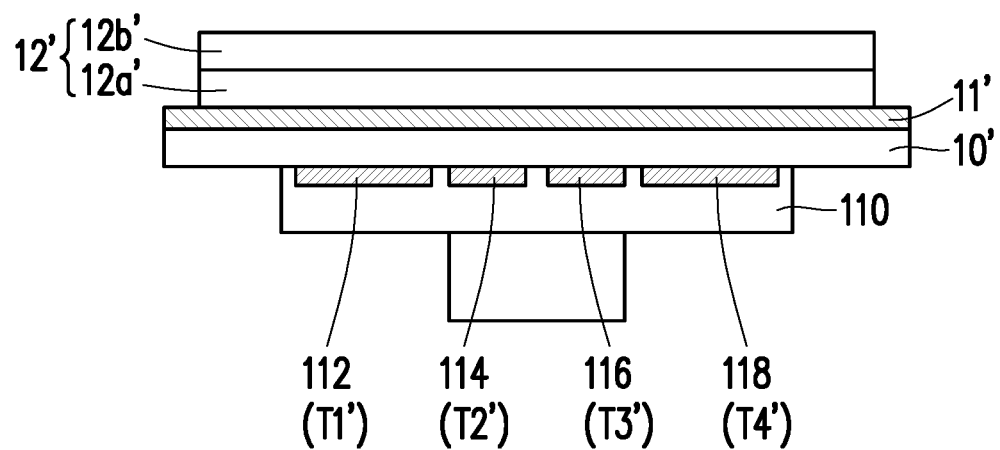
FIG. 7 to FIG. 10 are schematic cross sectional views of various stages in the process of forming a photoresist layer according to some embodiments of the present disclosure.

At step S110 of FIG. 6, a first photoresist layer 12' is formed on a first wafer 10' provided on a platen 110 as shown in FIG. 7. In some embodiments, the platen 110 is configured for supporting and spinning the first wafer 10'. The platen 110 can be, for example, an electrostatic chuck, which means an electrostatic force may be applied to the platen 110 for supporting the wafer 10 securely during the spin coating process. In other embodiments, the platen 110 may be a vacuum chuck or any suitable platen capable of holding the wafer 10 securely with any suitable means.

In some embodiments, the platen 110 includes a plurality of temperature zones 112, 114, 116, 118 being at a first set of process temperatures T1', T2', T3', T4'. Namely, the temperature zone 112 is at the process temperature T1', the temperature zone 114 is at the process temperature T2', the temperature zone 116 is at the process temperature T3', and the temperature zone 118 is at the process temperature T4'. For the initial setting, the process temperatures T1', T2', T3', T4' may be the same. Namely, the temperature profile of the whole platen 110 may be uniform. In some embodiments, for the initial setting, the process temperatures T1', T2', T3', T4' may all be about 22° C., but the disclosure is not limited thereto. The first photoresist layer 12' may be dispensed onto the platen 110 through the first outlet 144 and/or the second outlet 154.

In some embodiments, the first wafer 10' includes a metal layer 11' covering the process surface of the first wafer 10'. The first photoresist layer 12' is formed on the metal layer 11'. In one embodiment, the first photoresist layer 12' may be formed by a first photoresist coating 12a' dispensed from the first outlet 144 and a second photoresist coating 12b' dispensed from the second outlet 154. With such configuration, the temperature and the viscosity of the photoresist layer 12' on the wafer 10' can be controlled by adjusting the temperature of the first photoresist coating 12a' and the temperature of the second photoresist coating 12b'.

Figure 8:
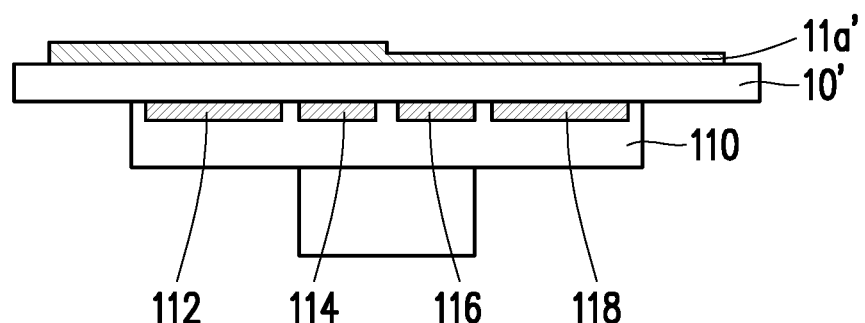

At step S120 of FIG. 6, a first etching process is performed on the first wafer 10' to form a first patterned metal layer 11a' as shown in FIG. 8. The etching process performed on the metal layer 11' is to remove where there is no first photoresist layer 12' covering. The etching process can be accomplished by either wet or dry etching. Then, a strip process is utilized to remove the first photoresist layer 12' and the resultant structure shown in FIG. 8 is obtained. In general, etching resistance of a photoresist layer is hard to control, and the degree of etching performed on the first patterned metal layer 11a' may be different. For example, the degree of etching may be more severe at the center of the wafer 10', while the degree of etching is milder at the edge of the wafer 10'. As such, the etched pattern on the wafer 10' may be relatively rough and uneven as shown in FIG. 8.

At step S130 of FIG. 6, a profile variation of the first patterned metal layer 11a' with respect to a reference profile is determined. In some embodiments, to obtain the profile variation of the first patterned metal layer 11a', a profile of the first patterned metal layer 11a' after the first etching process is firstly measured by, for example, a wafer inspection apparatus. Then, the profile of the first patterned metal layer 11a' is compared with the reference profile, which is the profile meant to achieve after the etching process.

Accordingly, the variation between the profile of the first patterned metal layer 11a' and the profile meant to achieve is obtained. For example, in the embodiment shown in FIG. 8, the thickness of the first patterned metal layer 11a on the right side is slightly thinner than that on the left side, which means the right side of the first patterned metal layer 11a' is etched slightly more severe than the left side of the first patterned metal layer 11a'.

Figure 9:
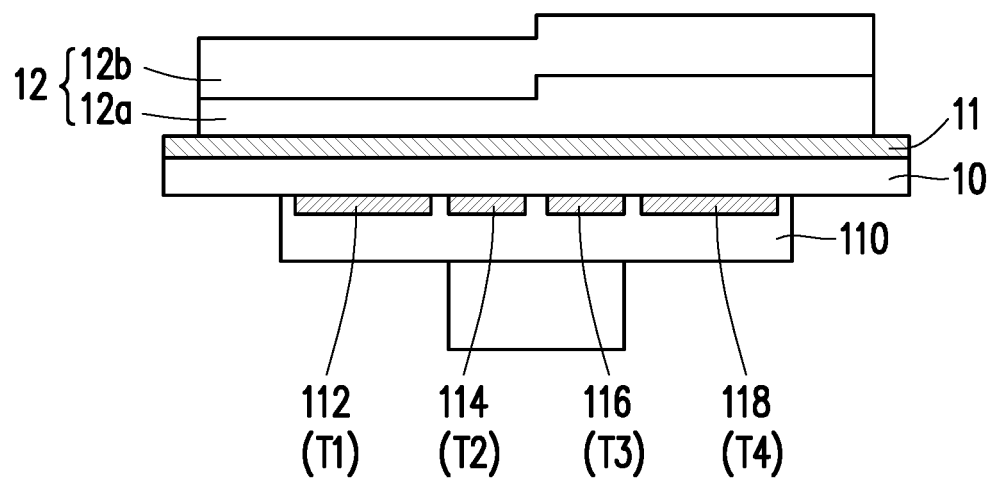

At step S140 and step S150 of FIG. 6, referring to FIG. 9, the first set of process temperatures is adjusted to a second set of process temperatures according to the profile variation. Then, a second photoresist layer is formed on a second wafer carried by the platen with the temperature zones being at the second set of process temperatures respectively. In some embodiments, in order to fix the profile variation, another photoresist layer with modified profile is formed according to the profile variation in order to adjust the etching resistance, and the profile modification of the photoresist layer can be achieved by utilizing the viscosity of the photoresist coating being inversely proportional to the temperature of the photoresist coating.

When the first photoresist layer 12' is formed, the temperature zones 112, 114, 116, 118 of the platen 110 are at the first set of process temperatures T1', T2' T3', T4'. In the present embodiment, the process temperatures T1', T2', T3', T4' are the same. Namely, the first photoresist layer 12' is formed on the platen 110 where the temperature thereof being uniform, which results in the profile variation of the first patterned metal layer 11a'. Therefore, the first set of process temperatures T1', T2' T3', T4 is adjusted to a second set of process temperatures T1, T2, T3, T4 according to the profile variation. In the present embodiment, more etching resistance is needed on the right side of the wafer since the thickness of the first patterned metal layer 11a on the right side is slightly thinner than that on the left side. Accordingly, when a second wafer 10 is provided on the platen 110, the process temperatures T3, T4 of the temperature zones 116, 118 on the right side is adjusted to be slightly lower than the process temperatures T1, T2 of the temperature zones 112, 114 on the left side. For example, the process temperatures T3, T4 of the temperature zones 116, 118 on the right side are adjusted to be substantially higher than 0° C. or the freezing point of the fluid and substantially equal to or lower than 22° C. The process temperatures T1, T2 of the temperature zones 112, 114 on the left side are adjusted to be substantially equal to or higher than 22° C. and substantially lower than 100° C. or the boiling point of the fluid. It is noted that the numerical ranges described herein are merely for illustration purpose and the disclosure is not limited thereto. As such, when the second photoresist layer 12 is formed on the second wafer 10 with the second set of process temperatures T1, T2, T3, T4 applied thereon, the second photoresist layer 12 is heated by the second set of process temperatures T1, T2, T3, T4 of the temperature zones 112, 114, 116, 118. Therefore, the viscosity of the second photoresist layer 12 on the right side would be slightly higher than the viscosity of the second photoresist layer 12 on the left side since the viscosity of the second photoresist layer 12 is inversely proportional to the temperature of the second photoresist layer 12. As a result, the thickness of the second photoresist layer 12 on the right side is slightly thicker than that on the left side as shown in FIG. 9. In addition, the platen 110 is spun to spread the second photoresist layer 12. The higher viscosity makes the shear stress within the photoresist layer larger, and the larger shear stress results in thicker photoresist layer after spun. Accordingly, the thickness of the second photoresist layer 12 on the right side is slightly thicker than that on the left side according to the profile variation of the first patterned metal layer 11a' so as to provide more etching resistance on the right side of the wafer 10.

Figure 10:
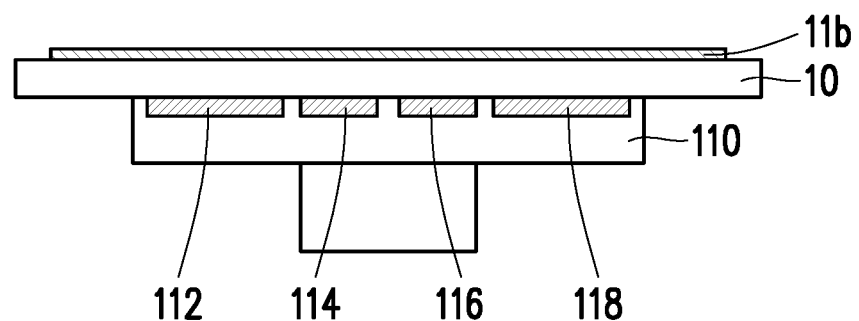

Then, a second etching process is performed on the metal layer 11 on the second wafer 10 by utilizing the second photoresist layer 12 as a mask to form a second patterned metal layer 11b as shown in FIG. 10. With the rectification described above, the profile variation of the second patterned metal layer 11b with respect to the reference profile meant to achieve should be less than the profile variation of the first patterned metal layer 11a'. If needed, the step S130 to step S150 can be repeated until the profile variation of the patterned metal layer with respect to the reference profile meant to achieve is less than a predetermined value. It is noted that the present embodiment is merely for illustration, the arrangement of the temperature zones and the process temperatures thereof can be adjusted according to actual profile variation of the patterned metal layer and is not limited thereto.

In some embodiments, the second photoresist layer 12 can be formed by dispensing multiple photoresist coatings with different temperatures on the platen 110. For example, a first photoresist coating 12a heated to the first heating temperature by the first heater of the temperature controlling apparatus described above may be dispensed on the second wafer 10, and a second photoresist coating 12b heated to the second heating temperature by the second heater described above may be dispensed on the second wafer 10. In some embodiments, the second heating temperature is different from the first temperature. As such, the first photoresist coating 12a and the second photoresist coating 12b stacked on top of one another (or mixed together) form the second photoresist layer 12 having a third temperature on the wafer 10. With such arrangement, the temperature and the viscosity of the photoresist layer 12 on the wafer 10 can be controlled by adjusting the first heating temperature of the first photoresist coating 12a and the second heating temperature of the second photoresist coating 12b. Accordingly, the thickness of the photoresist layer 12 formed on the wafer 10 can further be controlled by adjusting the temperatures of the first photoresist coating 12a and the second photoresist coating 12b.

Based on the above discussions, it can be seen that the present disclosure offers various advantages. It is understood, however, that not all advantages are necessarily discussed herein, and other embodiments may offer different advantages, and that no particular advantage is required for all embodiments.

In accordance with some embodiments of the disclosure, a temperature controlling apparatus includes a platen, a fluid source, a chiller, a first conduit and a second conduit. The fluid source is configured for supplying a fluid. The chiller is coupled to the fluid source for cooling the fluid in the fluid source to a cooling temperature. The first conduit includes a first inlet in fluid communication with the fluid source, a first outlet and a first heater configured to heat the fluid from the cooling temperature to a first heating temperature, wherein the fluid heated by the first heater is dispensed on the platen through the first outlet. The second conduit includes a second inlet in fluid communication with the fluid source, a second outlet and a second heater configured to heat the fluid from the cooling temperature to a second heating temperature different from the first heating temperature, wherein the fluid heated by the second heater is dispensed on the platen through the second outlet.

In accordance with some embodiments of the disclosure, a temperature controlling apparatus includes a fluid source, a chiller, a plurality of conduits, and a platen. The fluid source is configured for supplying a fluid. The chiller is coupled to the fluid source for cooling the fluid in the fluid source to a cooling temperature. The conduits are in fluid communication with the fluid source. Each of the conduits includes a heater configured to heat the fluid in each of the conduits. A heating temperature of the fluid in one of the conduits is different from a heating temperature of the fluid in another one of the conduits. The platen is configured to carry a wafer, wherein the fluid heated by each of the heaters is dispensed on the wafer through each of the conduits.

In accordance with some embodiments of the disclosure, a method for forming a photoresist layer includes the following steps. A first photoresist layer is formed on a first wafer carried by a platen, wherein the platen includes a plurality of temperature zones being at a first set of process temperatures. A first etching process is performed on the first wafer to form a first patterned metal layer. A profile variation of the first patterned metal layer with respect to a reference profile is determined. The first set of process temperatures is adjusted to a second set of process temperatures according to the profile variation. A second photoresist layer is formed on a second wafer carried by the platen with the temperature zones being at the second set of process temperatures respectively.

In accordance with some embodiments of the disclosure, a method for forming a photoresist layer includes the following steps. A first photoresist layer is formed on a first wafer provided on a platen. The platen includes a first temperature zone being at a first process temperature and a second temperature zone being at a second process temperature. A first etching process is performed on the first wafer to form a first patterned metal layer. A profile variation of the first patterned metal layer with respect to a reference profile is determined. The second process temperature is adjusted to a third process temperature different from the second process temperature according to the profile variation. The third process temperature is different from the second process temperature. A second photoresist layer is formed on a second wafer provided on the platen with the first temperature zone being at the first process temperature and the second temperature zone being at the third process temperature.

In accordance with some embodiments of the disclosure, a method for forming a photoresist layer includes the following steps. A first photoresist layer is formed on a first wafer provided on a platen. The platen includes a plurality of temperature zones being at a first set of process temperatures. A first etching process is performed on the first wafer to form a first patterned metal layer. A profile of the first patterned metal layer is measured by a wafer inspection apparatus. The measured profile of the first patterned metal layer is compared with a reference profile to obtain a profile variation. The first set of process temperatures is adjusted to a second set of process temperatures according to the profile variation. One of the process temperatures of the second set of process temperatures is different from another one of the process temperatures of the second set of process temperatures. A second photoresist layer is formed on a second wafer provided on the platen with the temperature zones being at the second set of process temperatures respectively.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a photoresist layer, comprising:
   forming a first photoresist layer on a first wafer provided on a platen, wherein the platen comprises a plurality of temperature zones being at a first set of process temperatures;
   performing a first etching process on the first wafer to form a first patterned metal layer;
   determining a profile variation of the first patterned metal layer with respect to a reference profile;
   adjusting the first set of process temperatures to a second set of process temperatures according to the profile variation;
   forming a second photoresist layer on a second wafer provided on the platen with the temperature zones being at the second set of process temperatures respectively.

2. The method for forming the photoresist layer as claimed in claim 1, wherein forming the second photoresist layer on the second wafer comprises:
   forming a first photoresist coating on the second wafer, wherein the first photoresist coating has a first temperature; and
   forming a second photoresist coating on the second wafer, wherein the second photoresist coating has a second temperature different from the first temperature, the first photoresist coating and the second photoresist coating form the second photoresist layer having a third temperature.

3. The method for forming the photoresist layer as claimed in claim 1, wherein the second photoresist layer is heated by the second set of process temperatures of the temperature zones, and a viscosity of the second photoresist layer is inversely proportional to a temperature of the second photoresist layer.

4. The method for forming the photoresist layer as claimed in claim 1, wherein forming the second photoresist layer on the second wafer further comprises:
   spinning the platen to spread the second photoresist layer.

5. The method for forming the photoresist layer as claimed in claim 1, wherein the first set of process temperatures comprises a first process temperature and a second process temperature, the first process temperature is equal to the second process temperature, the plurality of temperature zones comprises a first temperature zone and a second temperature zone, and forming the first photoresist layer comprises setting the first temperature zone at the first process temperature and setting the second temperature zone at the second process temperature.

6. The method for forming the photoresist layer as claimed in claim 5, wherein the second set of process temperatures comprises a third process temperature and a fourth process temperature, the third process temperature is different from the fourth process temperature, and forming the second photoresist layer comprises setting the first temperature zone at the third process temperature and setting the second temperature zone at the fourth process temperature.

7. The method for forming the photoresist layer as claimed in claim 6, wherein the third process temperature is equal to the first process temperature and the second process temperature.

8. The method for forming the photoresist layer as claimed in claim 1, wherein the first photoresist layer is formed to have a substantially uniform thickness.

9. The method for forming the photoresist layer as claimed in claim 1, wherein the second photoresist layer is formed to have a non-uniform thickness.

10. A method for forming a photoresist layer, comprising:
    forming a first photoresist layer on a first wafer provided on a platen, wherein the platen comprises a first temperature zone being at a first process temperature and a second temperature zone being at a second process temperature;
    performing a first etching process on the first wafer to form a first patterned metal layer;
    determining a profile variation of the first patterned metal layer with respect to a reference profile;
    adjusting the second process temperature to a third process temperature different from the second process temperature according to the profile variation;
    forming a second photoresist layer on a second wafer provided on the platen with the first temperature zone being at the first process temperature and the second temperature zone being at the third process temperature.

11. The method for forming the photoresist layer as claimed in claim 10, wherein forming the second photoresist layer on the second wafer comprises:
    forming a first photoresist coating on the second wafer, wherein the first photoresist coating has a first temperature; and
    forming a second photoresist coating on the second wafer, wherein the second photoresist coating has a second temperature different from the first temperature, the first photoresist coating and the second photoresist coating form the second photoresist layer having a third temperature.

12. The method for forming the photoresist layer as claimed in claim 10, wherein a viscosity of the second photoresist layer is inversely proportional to a temperature of the second photoresist layer.

13. The method for forming the photoresist layer as claimed in claim 10, wherein forming the second photoresist layer on the second wafer further comprises:
    spinning the platen to spread the second photoresist layer.

14. The method for forming the photoresist layer as claimed in claim 10, wherein the first photoresist layer is formed to have a substantially uniform thickness.

15. The method for forming the photoresist layer as claimed in claim 10, wherein the second photoresist layer is formed to have a non-uniform thickness.

16. A method for forming a photoresist layer, comprising:
    forming a first photoresist layer on a first wafer provided on a platen, wherein the platen comprises a plurality of temperature zones being at a first set of process temperatures;
    performing a first etching process on the first wafer to form a first patterned metal layer;
    measuring a profile of the first patterned metal layer by a wafer inspection apparatus;
    comparing the measured profile of the first patterned metal layer with a reference profile to obtain a profile variation;

adjusting the first set of process temperatures to a second set of process temperatures according to the profile variation, wherein one of the process temperatures of the second set of process temperatures is different from another one of the process temperatures of the second set of process temperatures;

forming a second photoresist layer on a second wafer provided on the platen with the temperature zones being at the second set of process temperatures respectively.

17. The method for forming the photoresist layer as claimed in claim 16, wherein forming the second photoresist layer on the second wafer comprises:

forming a first photoresist coating on the second wafer, wherein the first photoresist coating has a first temperature; and forming a second photoresist coating on the second wafer, wherein the second photoresist coating has a second temperature different from the first temperature, the first photoresist coating and the second photoresist coating form the second photoresist layer having a third temperature.

18. The method for forming the photoresist layer as claimed in claim 16, wherein the second photoresist layer is heated by the second set of process temperatures of the temperature zones, and a viscosity of the second photoresist layer is inversely proportional to a temperature of the second photoresist layer.

19. The method for forming the photoresist layer as claimed in claim 16, wherein forming the second photoresist layer on the second wafer further comprises:

spinning the platen to spread the second photoresist layer.

20. The method for forming the photoresist layer as claimed in claim 16, wherein the first photoresist layer is formed to have a substantially uniform thickness and the second photoresist layer is formed to have a non-uniform thickness.

* * * * *